(12) United States Patent
Kim et al.

(10) Patent No.: US 7,582,563 B2
(45) Date of Patent: Sep. 1, 2009

(54) METHOD FOR FABRICATING FULLY SILICIDED GATE

(75) Inventors: Dae-Young Kim, Seoul (KR); Han-Choon Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 209 days.

(21) Appl. No.: 11/639,257

(22) Filed: Dec. 15, 2006

(65) Prior Publication Data
US 2007/0141839 A1 Jun. 21, 2007

(30) Foreign Application Priority Data
Dec. 16, 2005 (KR) ............... 10-2005-0124451

(51) Int. Cl.
*H01L 21/44* (2006.01)
(52) U.S. Cl. ............... 438/682; 257/E21.438
(58) Field of Classification Search ........... 438/682; 257/E21.438
See application file for complete search history.

(56) References Cited

U.S. PATENT DOCUMENTS

| | | | | |
|---|---|---|---|---|
| 4,625,391 A | * | 12/1986 | Sasaki ............... | 438/625 |
| 4,994,402 A | * | 2/1991 | Chiu ............... | 438/297 |
| 5,407,837 A | * | 4/1995 | Eklund ............... | 438/151 |
| 5,467,308 A | * | 11/1995 | Chang et al. ........ | 365/185.01 |
| 5,627,395 A | * | 5/1997 | Witek et al. ........ | 257/350 |
| 5,946,240 A | * | 8/1999 | Hisamune ........... | 365/185.28 |
| 6,037,639 A | * | 3/2000 | Ahmad ............... | 257/401 |
| 6,284,662 B1 | * | 9/2001 | Mikagi ............... | 438/706 |
| 6,521,963 B1 | * | 2/2003 | Ota et al. ........... | 257/412 |
| 6,569,595 B1 | * | 5/2003 | Sato et al. .......... | 430/270.1 |
| 6,642,586 B2 | * | 11/2003 | Takahashi .......... | 257/390 |
| 6,930,363 B2 | * | 8/2005 | Jeng et al. .......... | 257/413 |
| 7,429,526 B1 | * | 9/2008 | Nayak et al. ........ | 438/592 |
| 2002/0045342 A1 | * | 4/2002 | Hu et al. ........... | 438/656 |
| 2003/0022473 A1 | * | 1/2003 | Matsumoto et al. .. | 438/514 |

* cited by examiner

*Primary Examiner*—N Drew Richards
*Assistant Examiner*—Ankush k Singal
(74) *Attorney, Agent, or Firm*—Finnegan, Henderson, Farabow, Garrett & Dunner, L.L.P.

(57) ABSTRACT

A method for fabricating a fully silicided gate, including forming a gate dielectric layer on a semiconductor substrate, depositing an amorphous silicon layer on the gate dielectric layer, forming a metallic layer on the amorphous silicon layer, depositing a hard mask on the metallic layer, wherein the amorphous silicon layer and the metal layer are silicided due to a thermal budget applied thereto, thereby forming a metal silicide layer, and patterning the metal silicide layer based on the hard mask to form a gate.

4 Claims, 3 Drawing Sheets

METHOD FOR FABRICATING FULLY SILICIDED GATE

RELATED APPLICATION

This application is based upon and claims the benefit of priority to Korean Application No. 10-2005-0124451, filed on Dec. 16, 2005, the entire contents of which are incorporated herein by reference.

TECHNICAL FIELD

The present invention relates to a method for fabricating a semiconductor device, and more particularly to a method for fabricating a fully silicided gate by using fully silicided silicon (FUSI).

BACKGROUND

As the channel size of a semiconductor device becomes less than or equal to 65 nm, the increase of effective oxide thickness due to depletion of a poly-silicon layer when forming a gate has been recognized as a significant problem. A metallic gate may be used for reducing the depletion effect of the poly-silicon layer. However, in order to use such a metallic gate, different metals should be used on NMOS and PMOS, respectively, in a fabricating process. Accordingly, there is proposed a fully silicided silicon (FUSI) method, in which a metallic layer is deposited on a poly-silicon layer, and a silicide is subsequently formed through a heat treatment.

However, in one example where cobalt (Co) is deposited on a poly-silicon layer, a cobalt silicide is formed through an annealing process, it is difficult to form FUSI only through the heat treatment of silicon and cobalt.

In one example where FUSI is formed by stacking cobalt on a poly-silicon layer, the cobalt needs be diffused into the relatively thicker and narrower poly-silicon to form a silicide. This causes the thus formed FUSI not close enough to a gate oxidation film formed in the lower portion of the poly-silicon. In order to prevent this from happening, a high-temperature heat treatment process should be added. The addition of such a high-temperature process, however, may lower device performance caused by the deterioration of a transistor due to an excessive thermal budget.

SUMMARY

Consistent with the present invention, there is provided a method for fabricating a fully silicided gate, capable of preventing the deterioration of a device due to thermal budget.

Consistent with a preferred embodiment of the present invention, there is provided a method for fabricating a fully silicided gate, including: forming a gate dielectric layer on a semiconductor substrate; depositing an amorphous silicon layer on the gate dielectric layer; forming a metallic layer on the amorphous silicon layer; and annealing the metallic layer and the amorphous silicon layer to silicidate the metallic layer and the amorphous silicon layer.

Consistent with another preferred embodiment of the present invention, there is provided a method for fabricating a fully silicided gate, including: forming a gate dielectric layer on a semiconductor layer; depositing an amorphous silicon layer on the gate dielectric layer; forming a metallic layer on the amorphous silicon layer; depositing a tetraethyl orthosilicate (TEOS) layer on the metallic layer thereby forming a hard mask by patterning the TEOS layer; and patterning the amorphous silicon layer and the metal layer based on the hard mask to form a gate.

BRIEF DESCRIPTION OF THE DRAWINGS

The above features of the present invention will become apparent from the following description of preferred embodiments given in conjunction with the accompanying drawings, in which.

DETAILED DESCRIPTION

Hereinafter, preferred embodiments of the present invention will be described in detail with reference to the accompanying drawings so that they can be readily implemented by those skilled in the art.

Figure 1:
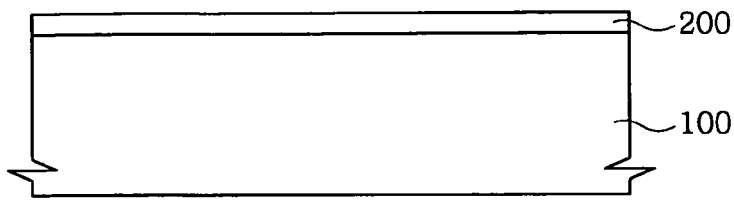
FIGS. 1 to 8 are sectional views schematically illustrating a method for fabricating a fully silicided gate using amorphous silicon, consistent with an embodiment of the present invention.

Referring to FIGS. 1 to 8, there are provided sectional views schematically illustrating a method for fabricating a fully silicided gate using amorphous silicon, consistent with an embodiment of the present invention. As shown in FIG. 1, first of all, a gate dielectric layer 200 having a thickness of about 16 Å is deposited on a silicon semiconductor substrate 100. Gate dielectric layer 200 may include a gate oxide.

Figure 2:
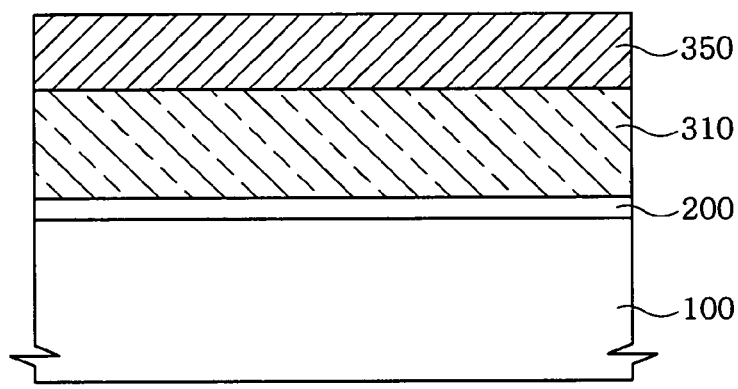

Referring to FIG. 2, an amorphous silicon layer 310 having a thickness of about 1000 Å is deposited on gate dielectric layer 200. Thereafter, a metallic layer, e.g., cobalt (Co), having a thickness of about 300 Å is formed on amorphous silicon layer 310, thereby forming a cobalt layer 350. Instead of cobalt, nickel (Ni) may also be used to form metallic layer 350.

Consistent with the present invention, metallic layer 350, made of, for example, cobalt (Co) and nickel (Ni), is formed on amorphous silicon to be silicided, thereby making forming of a fully silicided silicon more easily. By using the amorphous silicon, a more elaborated fully silicided silicon could be formed at a temperature lower than that of the existing process.

Figure 3:
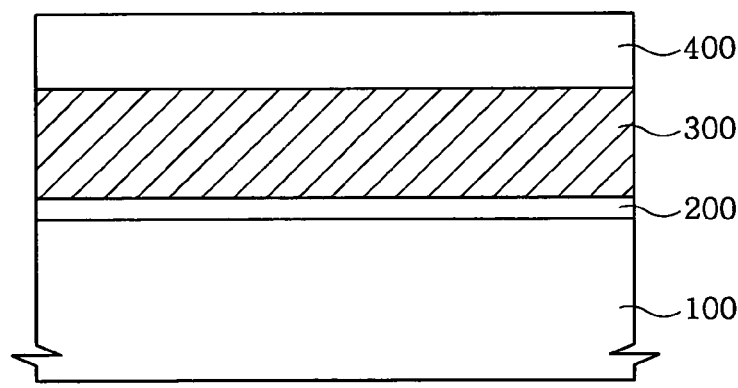

Referring to FIG. 3, a hard mask layer 400 is formed on cobalt layer 350 by depositing thereon a TEOS layer having a thickness of about 500 Å. At this time, the deposition of TEOS entails a deposition temperature, e.g., about 650° C., which causes cobalt layer 350 and amorphous silicon layer 310 to become fully silicided, thereby forming a metal silicide layer 300. That is, a first annealing process for silicidation naturally accompanies the formation of a TEOS layer.

Figure 4:
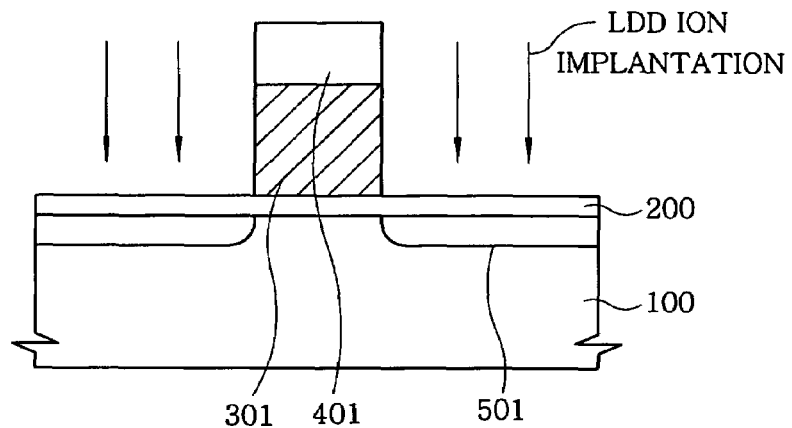

Referring to FIG. 4, a hard mask 401 is formed by patterning hard mask layer 400, and a gate 301 is formed by a reactive-ion etching (RIE) process using hard mask 401 as an etching mask. Thereafter, an LDD (Lightly Doped Drain) layer 501 is formed by performing LDD ion implantation.

Figure 5:
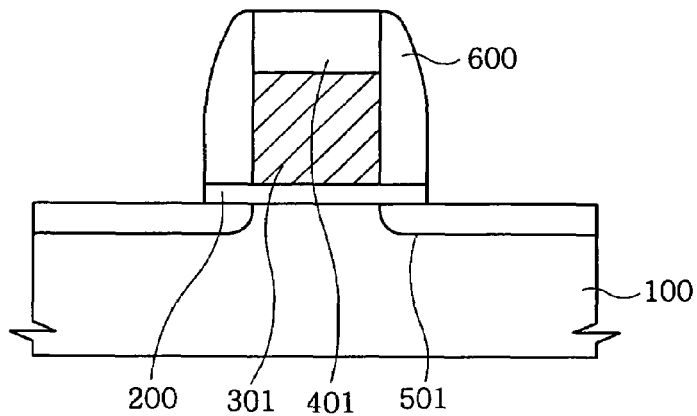

Referring to FIG. 5, an ONO (Oxide/Nitride/Oxide) layer is deposited on a sidewall of gate 301 and hard mask 401, thereby forming a spacer 600. The temperature employed for depositing such an ONO layer entails a thermal budget, which is a temperature that is higher than that for silicidation. Therefore, a substantial second annealing process for silicidation may be performed on hard mask 401 and gate 301.

Figure 6:
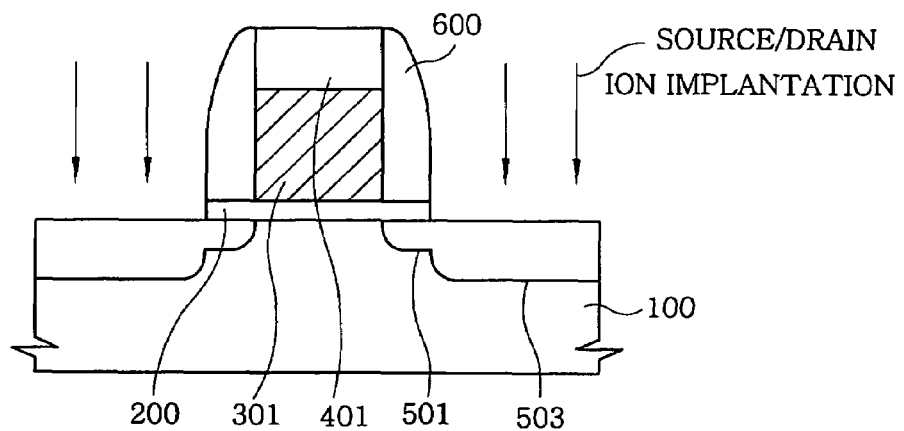

Referring to FIG. 6, source/drain 503 are formed by performing source/drain ion implantation.

Figure 7:
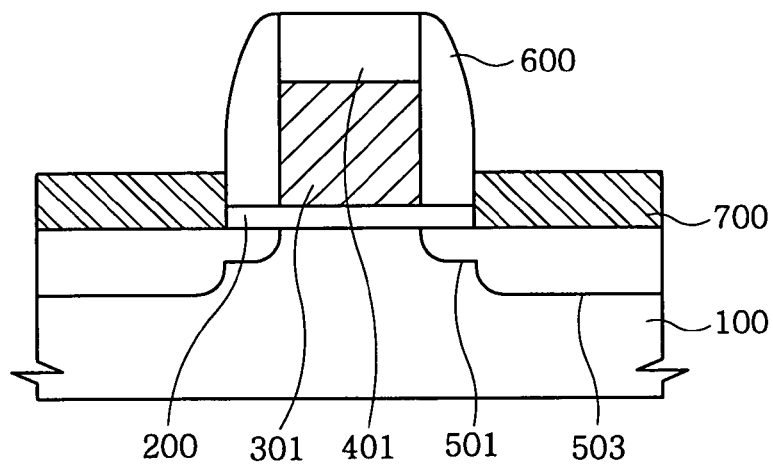

Referring to FIG. 7, a cobalt layer is deposited on source/drain 503, and source/drain electrodes 700 are then formed by performing a silicide process.

Figure 8:
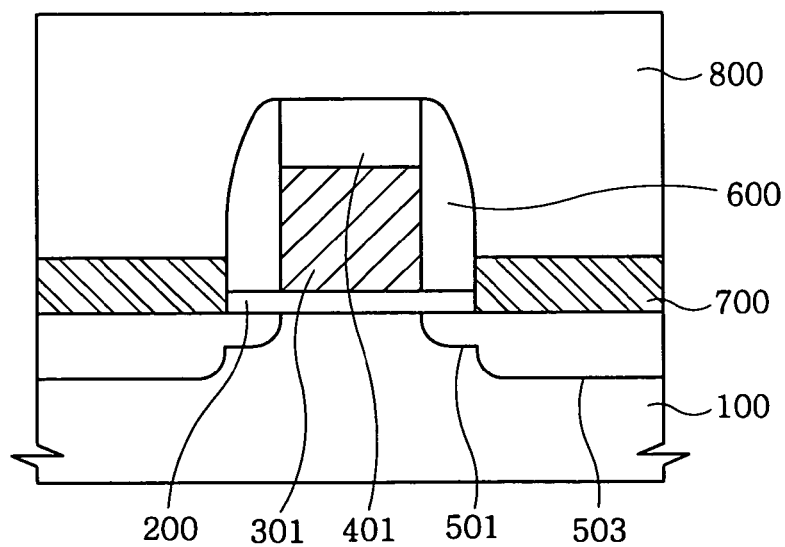

Referring to FIG. 8, an insulating layer 800 covering gate 301 and the like is formed using USG (Undoped Silicate Glass) or the like. Gate 301 formed in the manner set forth above is a fully silicided gate.

According to the description presented above, FUSI is formed on amorphous silicon, which may be silicided to form a gate. Accordingly, it is possible to form a gate electrode with a much lower temperature. In such a silicidation process, the formation of FUSI becomes much simpler. Further, the influence of thermal budget is minimized.

While the invention has been shown and described with respect to the preferred embodiments, it will be understood by those skilled in the art that various changes and modifications may be made without departing from the spirit and scope of the invention as defined in the following claims.

What is claimed is:

1. A method for fabricating a fully silicided gate, comprising:
   forming a gate dielectric layer on a semiconductor substrate;
   depositing an amorphous silicon layer on the gate dielectric layer;
   forming a metallic layer on the amorphous silicon layer;
   depositing a tetraethyl orthosilicate (TEOS) layer on the metallic layer thereby forming a hard mask by patterning the TEOS layer; and
   patterning the amorphous silicon layer and the metallic layer based on the hard mask to form a gate,
   wherein a thermal budget entailed by said depositing the TEOS layer causes the amorphous silicon layer and the metallic layer to be silicided, thereby forming a metal silicide layer.

2. The method of claim 1, wherein the metallic layer includes a cobalt (Co) layer.

3. The method of claim 1, wherein the metallic layer includes a nickel (Ni) layer.

4. A method for fabricating a fully silicided gate, comprising:
   forming a gate dielectric layer on a semiconductor substrate;
   depositing an amorphous silicon layer on the gate dielectric layer;
   forming a metallic layer on the amorphous silicon layer;
   depositing a tetraethyl orthosilicate (TEOS) layer on the metallic layer thereby forming a hard mask by patterning the TEOS layer;
   patterning the amorphous silicon layer and the metallic layer based on the hard mask to form a gate; and
   depositing an ONO (Oxide/Nitride/Oxide) layer on a sidewall of the gate thereby forming a spacer,
   wherein a thermal budget entailed by said depositing the TEOS layer causes the amorphous silicon layer and the metallic layer to be silicided, thereby forming a metal silicide layer, and
   wherein a thermal budget entailed by said depositing the ONO layer causes the hard mask and the gate to be silicided, thereby forming another metal silicide layer.

* * * * *